US007733181B2

(12) United States Patent
Jaeger et al.

(10) Patent No.: US 7,733,181 B2

(45) Date of Patent: Jun. 8, 2010

(54) AMPLIFIER CIRCUIT HAVING DYNAMICALLY BIASED CONFIGURATION

(75) Inventors: Kent Jaeger, Cary, IL (US); Lawrence E. Connell, Naperville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 39 days.

(21) Appl. No.: 12/154,648

(22) Filed: May 23, 2008

(65) Prior Publication Data

US 2009/0289716 A1 Nov. 26, 2009

(51) Int. Cl.
*H03F 3/45* (2006.01)

(52) U.S. Cl. ...................................... 330/261; 330/260

(58) Field of Classification Search .......... 330/252–261
See application file for complete search history.

(56) References Cited

U.S. PATENT DOCUMENTS 5,451,909 A 9/1995 Fattaruso
6,642,788 B1 11/2003 Abughazaleh et al.
7,259,626 B2 8/2007 Zolfaghari
2002/0036519 A1 3/2002 Krishnapura et al.
2008/0106336 A1 * 5/2008 Pera .......................... 330/260

* cited by examiner

*Primary Examiner*—Robert Pascal
*Assistant Examiner*—Hieu P Nguyen
(74) *Attorney, Agent, or Firm*—Charles W. Bethards

(57) ABSTRACT

Methods and corresponding systems for amplifying an input signal include inputting first and second differential input signals into first and second circuit legs, respectively, wherein the first circuit leg includes a first transistor coupled in series with a first variable current source, and wherein the second circuit leg includes a second transistor coupled in series with a second variable current source. The first and second variable current sources are dynamically set to provide first and second bias currents in response to the first and second differential input signals, wherein the first bias current is set inversely proportional to the second bias current. The first and second bias currents are sunk in the first and second circuit legs, respectively. First and second differential output signals are output from the first and second circuit legs, respectively.

20 Claims, 4 Drawing Sheets

AMPLIFIER CIRCUIT HAVING DYNAMICALLY BIASED CONFIGURATION

BACKGROUND

1. Field

This disclosure relates generally to an amplifier circuit, and more specifically to a differential amplifier circuit having a dynamically biased configuration.

2. Related Art

An amplifier circuit (or a buffer circuit (buffer)) can be used to adapt the output characteristics of one circuit to the input characteristics of another circuit. A buffer circuit can be considered an amplifier circuit with unity gain. In one example, a voltage buffer circuit can be used to transfer a voltage from a first circuit that has a high output impedance level, to a second circuit with a low input impedance level. Thus, the buffer prevents the second circuit from loading the first circuit unacceptably (e.g., with a large current load) and thus interfering with the desired operation of the first circuit.

Preferably, a buffer would not be needed between portions (e.g., first and second circuits) of a system. However, when a buffer circuit is needed, it is a goal for the design of the buffer circuit to minimize current consumption. By reducing current consumption, power consumption can be reduced, which is particularly important for portable battery powered devices that need extended operating time.

The inputs and outputs of cooperating circuits can be connected with differential signals or differential signaling. Differential signaling is a method of transmitting information electrically by means of two complementary signals sent on two separate wires or signal paths. At the receiving end of the transmission, the information is read or interpreted as the difference between the two complementary signals. Differential signaling increases noise immunity by rejecting common-mode interference, which is the interference that exists on, or is common to, both signal paths.

In amplifier circuits, or buffer circuits (e.g., a unity gain amplifier circuit), a current source (or a current sink, which may be thought of as a negative current source) can be used to bias transistor circuits. In an ideal current source, the current through the source remains constant as the voltage across the source changes. It is frequently desirable to increase the output resistance of the current source in order to make the current source more ideal. One way of increasing the output resistance of a current source is to add a cascode transistor, where the cascode transistor typically has a fixed voltage applied to the control input (e.g. the base or gate terminal) of the transistor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
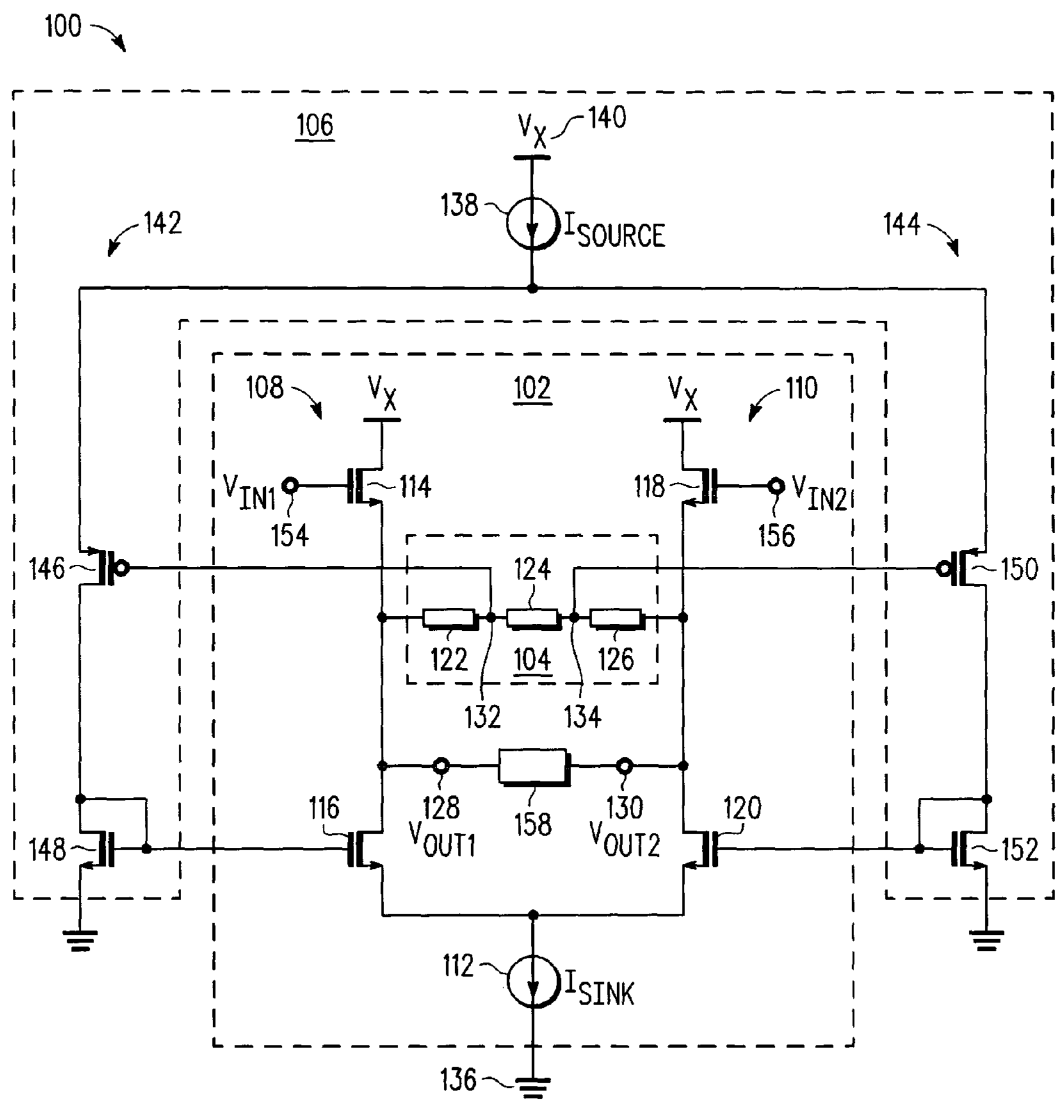
FIG. 1 is a high-level schematic diagram of an amplifier circuit in accordance with one or more embodiments.

Referring to FIG. 1, a high-level schematic diagram of an amplifier circuit 100 in accordance with one or more embodiments will be briefly discussed and described. In various embodiments, amplifier circuit 100 may be referred to as buffer circuit 100, particularly when amplifier circuit 100 has a gain close to 1. As shown, buffer circuit 100 can include a differential buffer circuit 102, a feedback circuit 104, and a bias circuit 106 or differential pair bias circuit.

Differential buffer circuit 102 can include first circuit leg 108 and second circuit leg 110, wherein the first and second circuit legs 108 and 110 are both coupled to common current source 112 (which can also be referred to as first current source 112). First circuit leg 108 can include transistors coupled in series, and second circuit leg 110 can include transistors coupled in series. For example, first circuit leg 108 can include first transistor 114 (which can also be referred to as first source follower transistor 114) connected in series with second transistor 116 (which can also be referred to as first cascode transistor 116). Second circuit leg 110 can include third transistor 118 (which can also be referred to as second source follower transistor 118) connected in series with fourth transistor 120 (which can also be referred to as second cascode transistor 120). A first terminal of common current source 112 can be coupled to first and second circuit legs 108 and 110 at a common node, and a second terminal of common current source 112 can be coupled to second voltage source 136.

First and second cascode transistors 116 and 120 can cooperate with common current source 112 to effectively provide two current sources, with one current source in each of the first and second current legs 108 and 110. Additionally, first and second cascode transistors 116 and 120 can increase the output impedance of common current source 112. The main property or feature of a current source (and similarly a current sink) is that the current though the source is independent of the voltage across it. In many current sources, the accuracy or linearity of the source depends upon the linearity of active devices such as transistors. In MOSFET transistors, saturation slopes (i.e., performance curves of drain-source current versus drain-source voltage at various gate-source voltages) increase with increasing gate-source voltages. For an ideal current source, these saturation region curves should be flat (i.e., very high channel or drain-to-source impedance). These saturation slopes extrapolate to a point on the x axis (e.g., x intercept) known as the channel length modulation parameter $\lambda$. When $\lambda$ is smaller, the slope in saturation curves will be smaller, and the performance of the current source will be better. As the slope in the saturation region is determined by the output impedance of the current source, then increasing the output impedance will greatly improve the performance of the current source/sink. Thus, if first and second cascode transistors 116 and 120 increase the output impedance of common current source 112, the cascode transistors can increase the performance of common current source 112, by effectively holding the voltage across common current source 112 more constant, which can hold the current through current source 112 more constant.

Feedback circuit 104 can include a series of resistive elements, one embodiment being shown as first resistive element 122, second resistive element 124, and third resistive element 126, wherein the resistive elements can be used for dividing or attenuating an output of differential buffer circuit 102, as that output is measured across first output terminal 128 and second output terminal 130. Feedback circuit 104 can produce a differential feedback signal, which can be measured across first feedback signal output 132 and second feedback signal output 134. In one embodiment, resistive elements 122, 124, and 126 can be implemented with a resistive material, such as a poly (polysilicon) resistor, or the like. In another embodiment, resistive elements 122, 124, and 126 can be implemented using active components, such as one or more transistors that are appropriately biased to provide a fixed resistance between the first and second terminals of the resistive elements.

Thus, feedback circuit 104 can be said to have differential outputs coupled to differential inputs of bias circuit 106, wherein, in one embodiment, the outputs and inputs are coupled at first feedback signal output 132 and second feedback signal output 134. Although feedback circuit 104 is shown within differential buffer circuit 102, it should be noted that feedback circuit 104 may be considered a separate circuit from differential buffer circuit 102. In another embodiment, feedback circuit 104 can be implemented with a circuit, such as an operational amplifier circuit, having an appropriate gain for attenuating, or otherwise conditioning, the differential output signal (at first and second output terminals 128 and 130) so that it can be input into bias circuit 106.

Bias circuit 106 can be used to receive the differential feedback signal from feedback circuit 104, and, in response thereto, produce first and second bias signals. The first and second bias signals can be used to dynamically bias first cascode transistor 116 and second cascode transistor 120, respectively, in response to the first and second buffer inputs 154 and 156 (first and second input terminals) in order to set first and second bias currents in the first and second circuit legs 108 and 110. This dynamic biasing occurs in near real time, with a speed and accuracy needed to produce a differential output signal with an envelope that substantially matches, or tracks, an envelope of the differential input signal. Thus, attempts should be made to reduce any delay or nonlinearities in feedback circuit 104 or bias circuit 106 that would cause the output signal envelope to differ from the input signal envelope.

Bias circuit 106 can include bias current source 138 (which can also be referred to as second current source 138), which can have a first terminal coupled to first voltage source 140. A second terminal of bias current source 138 can be coupled to both first differential pair leg 142 and second differential pair leg 144. The bias current source 138 may be viewed as providing or sourcing a differential pair source current.

First differential pair leg 142 can include first differential pair transistor 146 coupled to first load transistor 148, which in turn is coupled to second voltage source 136. In one embodiment, first load transistor 148 can be implemented with a diode-connected transistor (i.e., a transistor having its drain connected to its gate). Similarly, second differential pair leg 144 can include second differential pair transistor 150 coupled to second load transistor 152, which in turn is coupled to second voltage source 136. In one embodiment, second load transistor 152 can be implemented with a diode-connected transistor. A first feedback signal output 132 of feedback circuit 104 can be coupled as an input to a gate of first differential pair transistor 146, and a second feedback signal output 134 can be coupled as an input to a gate of second differential pair transistor 150. First differential pair transistor 146 may also be referred to as fifth transistor 146. First load transistor 148 may also be referred to as sixth transistor 148. Second differential pair transistor 150 may also be referred to as seventh transistor 150. Second load transistor 152 may also be referred to as eighth transistor 152.

With regard to outputs, bias circuit 106 can output a first bias signal, which is received as an input by differential buffer circuit 102 at a node connecting the gates of first cascode transistor 116 and first load transistor 148. Similarly, a second bias signal can be output by differential pair bias circuit 106, and in turn be received as an input by differential buffer circuit 102 at a node connecting the gates of second cascode transistor 120 and second load transistor 152.

In a more detailed description of the embodiment shown in FIG. 1, buffer circuit 100 can include first current source 112 (also referred to as common current source 112) and second current source 138 (also referred to as bias current source 138). Second current source 138 can have a first terminal coupled to first voltage source 140. First current source 112 can have a second terminal coupled to second voltage source 136. In one embodiment, first voltage source 140 can be set in a range from 2.3 volts (V) to 2.5V, and second voltage source 136 can be set to 0 volts. Note that in the embodiment shown in FIG. 1, first voltage source 140 is connected to the first terminal of second current source 138 and also to drain terminals of first transistor 114 and third transistor 118. In another embodiment, the voltage source connected to drain terminals of first transistor 114 and third transistor 118 can be different from first voltage source 140, wherein the voltage can be lower than first voltage source 140.

In first circuit leg 108, first transistor 114 can be of a first (or one) conductivity type (e.g., an n-channel transistor), and can have a first (or one) current electrode (e.g., a source electrode), a second (or another) current electrode (e.g., a drain electrode) coupled to first voltage source 140, and a control electrode (e.g. a gate electrode) coupled to first input terminal or buffer input 154, which is labeled $V_{IN1}$.

First transistor 114 can be connected in series with second transistor 116. Second transistor 116 can be of the first conductivity type (n-channel), and can have a control electrode (gate), a first current electrode (source) coupled to the first terminal of first current source 112, and a second current electrode (drain) coupled to the first current electrode (source) of first transistor 114, and to first output terminal 128.

In second circuit leg 110, third transistor 118 can be of the first conductivity type (n-channel), and can have a first current electrode (source), a second current electrode (drain) coupled to first voltage source 140, and a control electrode (gate) coupled to second input terminal or buffer input 156, which is labeled $V_{IN2}$.

Fourth transistor 120 can be connected in series with third transistor 118. Fourth transistor 120 can be of the first conductivity type (n-channel), and can have a control electrode (gate), a first current electrode (source) coupled to the first terminal of first current source 112, and a second current electrode (drain) coupled to the first current electrode (source) of third transistor 118, and to second output terminal 130.

In feedback circuit 104, which can be used to produce a differential feedback signal, resistive elements 122, 124, and 126 can be coupled in series across the differential output of buffer circuit 100, which differential output is found at first output terminal 128 (which is labeled $V_{OUT1}$) and second output terminal 130 (which is labeled $V_{OUT2}$). More specifically, first resistive element 122 can have a first terminal coupled to first output terminal 128, and a second terminal coupled to first feedback signal output 132. Second resistive element 124 can have a first terminal coupled to first feedback signal output 132, and a second terminal coupled to second feedback signal output 134. Third resistive element 126 can have a first terminal coupled to second feedback signal output 134, and a second terminal coupled to second output terminal 130. Note that the first terminal of first resistive element 122 can be referred to as a "first sense input" of feedback circuit 104, and that the second terminal of third resistive element 126 can be referred to as a "second sense input" of feedback circuit 104.

In bias circuit 106—which includes first differential pair leg 142—fifth transistor 146 of a second (or another) conductivity type (e.g., a p-channel transistor) can have a first current electrode (source) coupled to the second terminal of second current source 138, a second current electrode (drain), and a control electrode (gate) coupled to first feedback signal output 132.

Sixth transistor 148 of the first conductivity type (n-channel) can have a first current electrode (source) coupled to second voltage source 136, a second current electrode (drain) coupled to the second current electrode (drain) of fifth transistor 146, and a control electrode (gate) coupled to the second current electrode of sixth transistor 148, and to the control electrode of second transistor 116, for dynamically controlling second transistor 116 in response to the differential feedback signal, which is a differential signal (e.g., voltage) across first feedback signal output 132 and second feedback signal output 134.

In second differential pair leg 144 of bias circuit 106, seventh transistor 150 of the second conductivity type (p-channel) can have a first current electrode (source) coupled to the second terminal of second current source 138, a second current electrode (drain), and a control electrode (gate) coupled to second feedback signal output 134.

Eighth transistor 152 of the first conductivity type (n-channel) can have a first current electrode (source) coupled to second voltage source 136, a second current electrode (drain) coupled to the second current electrode (drain) of seventh transistor 150, and a control electrode (gate) coupled to the second current electrode (drain) of eighth transistor 152, and to the control electrode of fourth transistor 120, for dynamically controlling fourth transistor 120 in response to the differential feedback signal, which is a differential signal (e.g., voltage) across first feedback signal output 132 and second feedback signal output 134.

Figure 3:
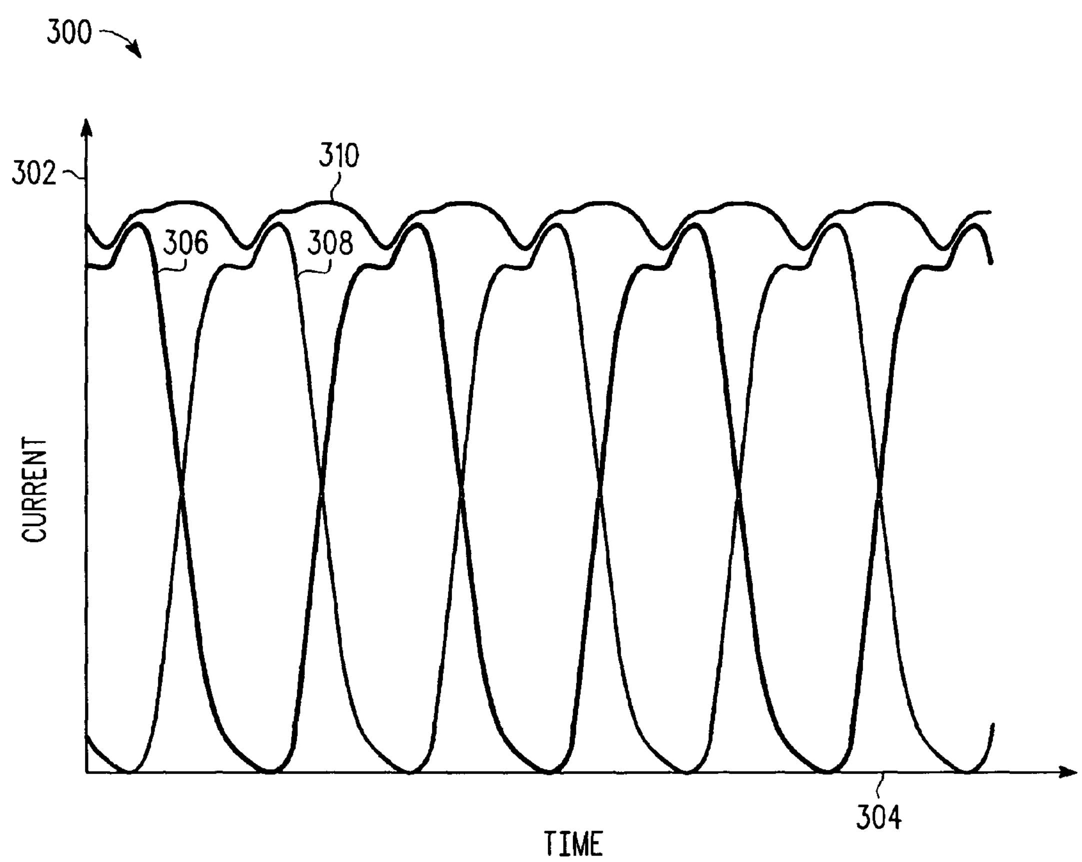
FIG. 3 is a graph depicting current flow in various portions of the amplifier circuit of FIG. 1 in accordance with one or more embodiments.

In FIG. 3, there is depicted graph 300 that represents current levels in parts of buffer circuit 100 shown in FIG. 1 in accordance with one or more embodiments. Vertical axis 302 of graph 300 can represent current level or amplitude, while horizontal axis 304 can represent time. With a differential sine wave input into first differential input 154 and second differential input 156, waveform 306 can represent a current flowing in first circuit leg 108 (see FIG. 1), and waveform 308 can represent a current flowing in second circuit leg 110. Waveform 310 can represent a total current sunk by common current source 112. Note that the total current through common current source 112 remains fairly constant, with some variation because of the $V_{DS}$ voltage swing across it. Note that in the embodiment tested to produce graph 300, common current source 112 was not an ideal source; it was implemented using an FET transistor in a current mirror configuration. As the $V_{DS}$ changes, the current mirroring ability is impacted.

Waveforms 306 and 308, which represent the current through first and second circuit legs 108 and 110, can illustrate a current steering aspect of buffer circuit 100, wherein the current in first circuit leg 108 varies inversely with the current in second current leg 110. In many prior art differential buffer circuits, first and second circuit legs (analogous to 108 and 110) can be coupled to two respective fixed current sources. In contrast, in the embodiment shown in FIG. 1, common current source 112, in conjunction with first cascode transistor 116 and second cascode transistor 120, acts as two variable current sources that vary inversely. This allows buffer 100 to implement a technique that dynamically steers the bias current from first circuit leg 108 to second circuit leg 110 as needed according to a signal (e.g., voltage) across first output terminal 128 and second output terminal 130 (or, correspondingly, according to a voltage across first differential input 154 and second differential input 156). Under typical circumstances, this current steering technique can be used to save approximately one half of the bias current that is used in similar prior art differential amplifier and buffer circuits.

In the operation of buffer 100, when the voltage at first differential input 154 is greater than the voltage at second differential input 156, first transistor 114 becomes more conductive, and the voltage at first output terminal 128 begins to rise (e.g. follows the voltage at the gate of transistor 114 less a $V_{GS}$ drop). Conversely, third transistor 118 tends to become more resistive, and the voltage at second output terminal 130 falls lower (e.g. follows the voltage at the gate of transistor 118 less a $V_{GS}$ drop). Feedback circuit 104 senses the voltage across first and second output terminals 128 and 130, attenuates that voltage, and outputs a differential feedback signal (e.g., a voltage) across first and second feedback outputs 132 and 134. In this example, the voltage at first feedback output 132 is greater than the voltage at the second feedback output 134, because the voltage at the first differential input 154 exceeds that at the second differential input 156.

The differential feedback signal can be input into bias circuit 106, and more specifically into the gates of fifth transistor 146 and seventh transistor 150, respectively. When the voltage at the gate of fifth transistor 146 is greater than the voltage at the gate of seventh transistor 150, the current output by bias current source 138 is steered, or proportionately divided, between first differential pair leg 142 and second differential pair leg 144 according to the difference in the differential voltage input (or output) of buffer 100.

In one embodiment, a size relationship (e.g., a length-width ratio relationship) between second and sixth transistors 116 and 148, and similarly between fourth and eighth transistors 120 and 152, can be used to properly bias transistors 116 and 120 over temperature and process variations. While second and fourth transistors 116 and 120 are cascode transistors, they are also part of a differential pair (e.g., second transistor 116 can be paired with sixth transistor 148, and fourth transistor 120 can be paired with eighth transistor 152). As part of a differential pair, they are part of a circuit that has gain. To reduce the amplification of noise generated by sixth transistor 148 and eighth transistor 152, capacitors can be added to the gates of second transistor and fourth transistor 116 and 120. When these capacitors are added, current source 138 can be increased in order to drive the capacitors with an appropriate slew rate. Additionally, capacitors can also be connected between the gate and drain of second transistor 116 and fourth transistor 120 in order to produce a Miller capacitor on their gates.

Figure 2:
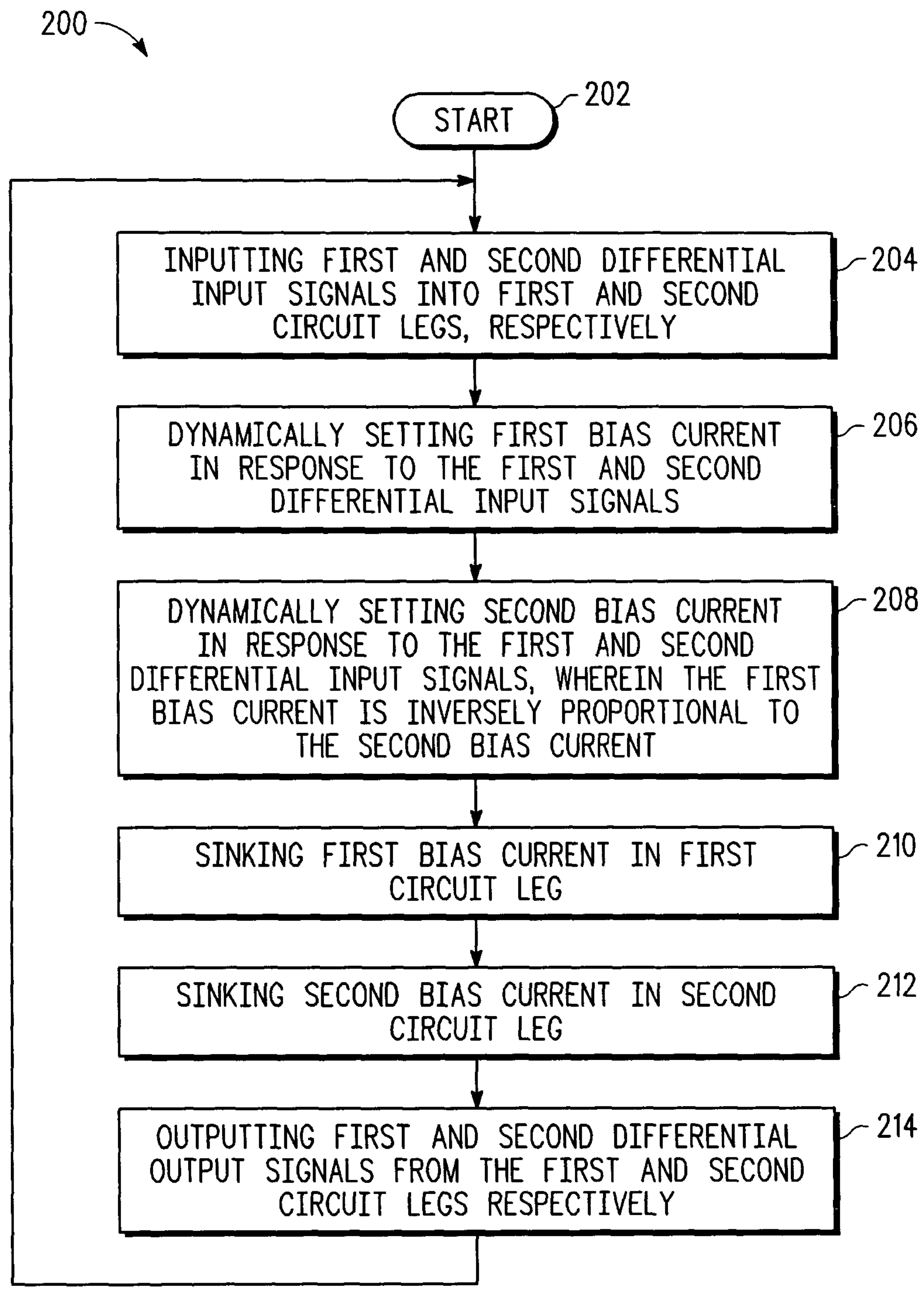
FIG. 2 is a flowchart of one or more processes that can be implemented in an amplifier circuit in accordance with one or more embodiments.

Referring now to FIG. 2, there is depicted a high-level flowchart 200 of one or more processes that can be executed by buffer circuit 100, or another similar circuit with appropriate functionality, in accordance with the one or more embodiments. As shown, flowchart 200 begins at 202, and thereafter passes to 204, wherein the process inputs first and second differential input signals into first and second circuit legs, respectively. In one embodiment, the first and second circuit legs can each include a transistor coupled in series with a variable current source.

For example, in the embodiment shown in FIG. 1, first circuit leg 108 can include first transistor 114 (which can also be referred to as first source follower transistor 114) coupled in series with second transistor 116 (which can also be referred to as first cascode transistor 116), wherein the second transistor 116 cooperates with common current source 112 to form a first variable current source in first circuit leg 108. Second circuit leg 110 can include third transistor 118 (which can also be referred to as second source follower transistor 118) coupled in series with fourth transistor 120 (which can also be referred to as second cascode transistor 118), wherein the fourth transistor 120 cooperates with common current source 112 to form a second variable current source in second circuit leg 110. A first differential input signal can be input by applying the signal to a control electrode (gate) of first transistor 114, as shown at input terminal 154. A second differential input signal can be input by applying the signal to a control electrode (gate) of second transistor 118, as shown at input terminal 156.

After inputting first and second differential input signals, the process can dynamically set a first bias current in response to the first and second differential input signals, as illustrated at 206. In one embodiment, dynamically biasing first cascode transistor 116 can set a first variable current source to produce a first bias current in first circuit leg 108.

Similarly, as depicted at 208, the process can dynamically set a second bias current in response to the first and second differential input signals, wherein the first bias current is inversely proportional to the second bias current. This process can be implemented in one embodiment by dynamically biasing second cascode transistor 120 to set a second variable current source to produce a second bias current in second circuit leg 110.

In the embodiment shown in FIG. 1, dynamically biasing first and second cascode transistors 116 and 118 can be implemented with first and second bias signals output from bias circuit 106. First and second bias signals are responsive to the first and second differential input signals because the first and second bias signals can be derived from steering, or proportionately dividing, the current output by bias current source 138 in response to a differential voltage output of buffer circuit 102 (e.g., the signals at first and second feedback outputs 132 and 134), which is in turn related to the differential input to differential buffer circuit 102.

After setting the first and second variable current sources, the process sinks a first bias current in the first circuit leg, as illustrated at 210. In one embodiment, the first bias current can be sunk with the first variable current source, where the first current source can be implemented with first cascode transistor 116 cooperatively coupled to common current source 112.

In a similar manner, the process sinks a second bias current in the second circuit leg, as depicted at 212. In one embodiment, the second bias current can be sunk with the second variable current source, where the second current source can be implemented with second cascode transistor 120 cooperatively coupled to common current source 112.

In the embodiment shown in FIG. 1, sinking the first and second bias currents can be implemented with common current source 112. Note that the current through common current source 112 should be substantially equal to the current flowing through first circuit leg 108 plus the current flowing through second circuit leg 110. Additionally, the total current drawn by first current source 112 can be proportionately divided, or steered, between first and second circuit legs 108 and 110 in response to the differential feedback signal. Because common current source 112 is a common portion of both the first variable current source in the first circuit leg and the second variable current source in the second current leg, any increase in current in the first circuit leg will substantially equal a decrease in current in the second current leg, and vice versa. Thus, the first bias current is necessarily inversely proportional to the second bias current in embodiments where common current source 112 is a shared portion of the first and second variable current sources.

The differential feedback signal is provided by feedback circuit 104, which can be connected to first and second output terminals 128 and 130. Because the differential output of buffer circuit 102 is related to the differential input, in an alternative embodiment, feedback circuit 104 can receive inputs from first differential input 154 and second differential input 156.

Finally, the process outputs first and second differential output signals from the first and second circuit legs, respectively, as illustrated at 214. In the embodiment shown in FIG. 1, first and second differential output signals can be output from first output terminal 128 and second output terminal 130. Output terminals 128 and 130 can be connected to load 158, which, in some embodiments, can be implemented with an input impedance of a subsequent stage of a system in which buffer circuit 100 is used. For example, in a communications system, buffer circuit 100 can be used to buffer the output of a filter circuit before it is passed to a mixer circuit.

Following 214, the process can iteratively return to 204, wherein the process can continue to input first and second differential input signals. Thus, the process depicted in flowchart 200 can be iteratively repeated, indefinitely, as buffer circuit 100 receives differential input signals and outputs differential output signals. The process depicted in flowchart 200 can be performed by manipulating analog signals using analog circuitry, which, in some embodiments, can be implemented in an integrated circuit. When analog signals are processed, the processes depicted in flowchart 200 can occur substantially simultaneously by various portions of the analog circuitry. In other embodiments, one or more steps in the process can be implemented using digital signals and digital computations. For example, feedback circuit 104 and bias circuit 106 may have portions implemented digitally in order to bias the first and second cascode transistors in a manner that steers current through first and second circuit legs 108 and 110.

Figure 4:
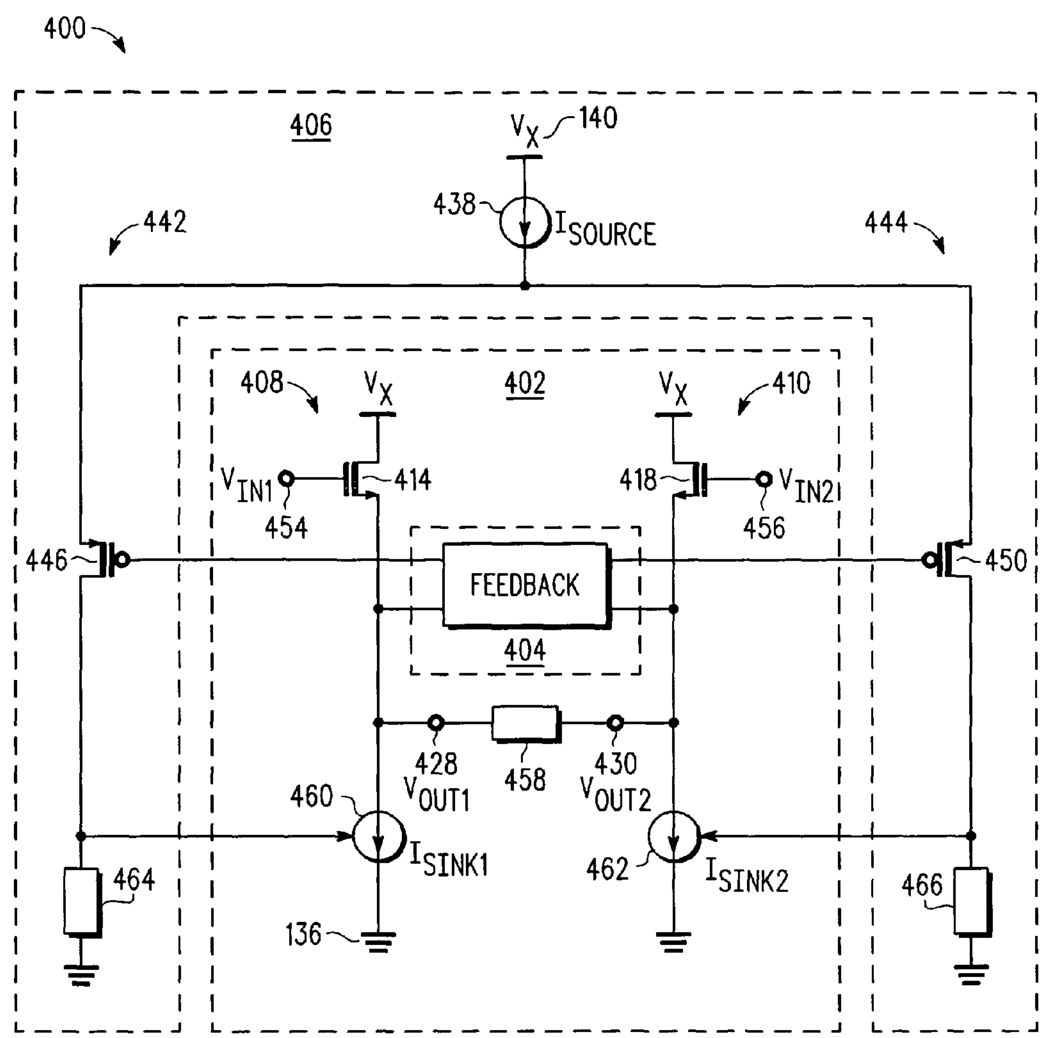
FIG. 4 is a high-level schematic diagram of another embodiment of an amplifier circuit.

In FIG. 4, there is depicted a high-level schematic diagram of another embodiment of an amplifier circuit. Similar to the embodiment shown in FIG. 1, amplifier circuit 400 can generally include differential amplifier circuit 402, feedback circuit 404, and bias circuit 406.

Differential amplifier circuit 402 includes first circuit leg 408 and second circuit leg 410. First circuit leg 408 includes first transistor 414 coupled in series with first variable current source 460, and second current leg 410 includes second transistor 418 coupled in series with second variable current source 462. An output of differential amplifier circuit 402 can be provided across first and second output terminals 428 and 430. Load 458 can be coupled to first and second output terminals 428 and 430.

First and second variable current sources 460 and 462 can be dynamically set, varied, or adjusted, to provide (i.e., sink) first and second bias currents for first and second circuit legs 408 and 410, respectively. The first and second bias currents can be set according to differential input signals 454 and 456 input into amplifier circuit 400. In one embodiment, first and second bias currents can vary inversely with respect to the other in response to the differential input signal so that the sum of the first and second bias currents can remain relatively constant.

In circuit leg 408, first transistor 414 may be referred to as a first source follower transistor. Similarly, in circuit leg 410, second transistor 418 may be referred to as a second source follower transistor.

Even though there are two separate current sources (460, 462) for the two circuit legs (408, 410) in the embodiment shown in FIG. 4, amplifier circuit 400 can operate in a manner similar to the operation of amplifier or buffer circuit 100 (see FIG. 1), wherein bias current can be shifted between first and second circuit legs in response to the differential input signal, while a total bias current (i.e., the sum of the first and second bias currents) remains substantially or relatively constant. As bias current is shifted from one circuit leg to another, the first and second variable current sources vary inversely (i.e., as current increases in one variable current source, current decreases in the other, and vice versa).

Note that an analog of first variable current source 460 can be implemented, as shown in FIG. 1, with common current source 112 in combination with first cascode transistor 116. An analog of second variable current source 462 can be implemented, as shown in FIG. 1, with common current source 112 in combination with second cascode transistor 120. These variable current sources in FIG. 1 can be inversely varied in response to first and second bias outputs from bias circuit 106, which can be coupled to control electrodes of first and second cascode transistors 116 and 120. Thus, common current source 112 is a part of both the first and the second variable current sources, and it passes a total bias current, with the total bias current being substantially equal to the sum of first and second bias currents, which vary inversely as current is shifted between the first and second circuit legs.

Feedback circuit 404 is shown as a functional block that receives differential input voltages (or signals) proportional to the voltages (or signals) input at first differential input 454 and second differential input 456, and produces a differential feedback signal comprising a first feedback signal and a second feedback signal. The differential input signals input into feedback circuit 404 can come from first and second differential output signals at first and second output terminals 428 and 430. Alternatively, differential input signals input into feedback circuit 404 can come from the differential inputs (terminals 454, 456) of amplifier circuit 400. In some embodiments, first and second feedback signals output by feedback circuit 404 are attenuated, or appropriately scaled, signals corresponding to the differential input signals input into feedback circuit 404.

Bias circuit 406 can receive the differential feedback signal from feedback circuit 404, and, in response thereto, produce first and second bias signals that can be used to dynamically set or adjust first and second variable current sources 460 and 462. Bias circuit 406 can include bias current source 438, which outputs a current that can be shifted, or divided, between first and second differential pair legs 442 and 444 in response to the differential feedback signal from feedback circuit 404. The bias current source 438 may be viewed as sourcing a differential pair source current.

Differential pair leg 442 can include first differential pair transistor 446 coupled to first load 464, which is in turn coupled to second voltage source 136. First load 464 can be implemented with a resistive element, a diode, or a transistor. In one embodiment, first load 464 can be a diode-connected transistor. The first bias signal is produced across first load 464 in accordance with the portion of current from bias current source 438 that flows through first differential pair leg 442.

Similarly, second differential pair leg 444 can include second differential pair transistor 450 coupled to second load 466, which in turn is coupled to second voltage source 136. Second load 466 can be implemented with a resistive element, a diode, a transistor, or a diode connected transistor. The second bias signal is produced across second load 466 in accordance with the portion of current from bias current source 438 that flows through second differential pair leg 444.

The techniques of steering current between circuit legs of a differential amplifier circuit described above can have several advantages. For example, in a differential circuit using a source follower configuration in the circuit legs, the amount of bias current used can be nearly cut in half compared to a prior art differential source follower circuit having a fixed current source for each circuit leg. In the prior art, each source follower circuit leg would need a current source that sinks the maximum expected current for each circuit leg. In the embodiment shown in FIG. 1, only one current source 112 is needed, which cuts the current nearly in half.

Another advantage is that the number of current sources and cascode devices can be reduced by one half, thus reducing the integrated circuit area required to implement buffer circuit 100.

Yet another advantage of buffer 100 is a reduction in the amount of supply current variation, which improves the operation and stability of a circuit that may use buffer circuit 100. Reducing supply current variation can also help reduce coupling into noise sensitive circuits (e.g., a voltage controlled oscillator) through a common power supply. For example, when buffer 100 is used to produce an amplitude modulated transmit signal, its ability to reduce supply current variation will advantageously reduce the amount it can remodulate a transmit VCO through a shared power supply.

Although the invention is described herein with reference to specific embodiments, various modifications and changes can be made without departing from the scope of the present invention as set forth in the claims below. For example, while the techniques and apparatus for amplifying or buffering a differential input signal may vary widely, one or more embodiments can be used in signal processing or communication systems applications. For example, the buffering techniques set forth herein can be used in a transmitter, or a receiver, or a high-speed switched communication system, or the like. The amplifying or buffering techniques set forth herein can be used between various stages or functions in a system wherein a differential output of a first stage needs to be amplified or buffered in order to interface with an input of a second stage. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or an essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An amplifier circuit comprising:

a differential amplifier circuit having a first circuit leg and a second circuit leg, wherein the first circuit leg has a first transistor in series with a first variable current source, and wherein the second circuit leg has a second transistor in series with a second variable current source;

a feedback circuit coupled to the differential amplifier circuit for producing a differential feedback signal; and a bias circuit coupled to the feedback circuit for receiving the differential feedback signal, the bias circuit coupled to the first and second variable current sources for inversely varying the first variable current source with respect to the second variable current source in response to the differential feedback signal, wherein the first variable current source comprises a first cascode transistor in the first circuit leg that is coupled to a common current source, and wherein the second variable current source comprises a second cascode transistor in the second circuit leg that is coupled to the common current source.

2. The amplifier circuit according to claim 1 wherein the bias circuit is coupled to the first and second cascode transistors for dynamically biasing the first and second circuit legs of the differential amplifier circuit in response to the differential feedback signal.

3. The amplifier circuit according to claim 1 wherein the feedback circuit coupled to the differential amplifier circuit comprises a feedback circuit coupled to a differential output of the differential amplifier circuit.

4. The amplifier circuit according to claim 1 wherein the feedback circuit coupled to the differential amplifier circuit comprises a feedback circuit coupled to a differential input of the differential amplifier circuit.

5. The amplifier circuit according to claim 2:

wherein the first transistor further comprises a first source follower transistor of a first conductivity type having a first current electrode, a second current electrode coupled to a first voltage source, and a control electrode coupled to a first input terminal;

wherein the first cascode transistor further comprises a first cascode transistor of the first conductivity type having a first current electrode coupled to the common current source, a second current electrode coupled to the first current electrode of the first source follower transistor, and a control electrode coupled to a first bias output of the bias circuit;

wherein the second transistor further comprises a second source follower transistor of the first conductivity type having a first current electrode, a second current electrode coupled to the first voltage source, and a control electrode coupled to a second input terminal; and wherein the second cascode transistor further comprises a second cascode transistor of the first conductivity type having a first current electrode coupled to the common current source, a second current electrode coupled to the first current electrode of the second source follower transistor, and a control electrode coupled to a second bias output of the bias circuit.

6. The amplifier circuit according to claim 1 wherein the feedback circuit comprises a circuit for scaling an output signal of the differential amplifier circuit to produce the differential feedback signal.

7. The amplifier circuit according to claim 2 wherein the bias circuit comprises a bias current source coupled to a differential transistor pair, wherein the differential transistor pair has a first differential pair transistor in a first differential pair leg, and a second differential pair transistor in a second differential pair leg, wherein the first and second differential pair transistors are coupled to the first and second cascode transistors, respectively, for dynamically biasing the first and second circuit legs.

8. The amplifier circuit according to claim 7 wherein the differential feedback signal comprises a first differential feedback signal and a second differential feedback signal, and wherein the first differential pair transistor has a control electrode coupled to the first differential feedback signal, and wherein the second differential pair transistor has a control electrode coupled to the second differential feedback signal.

9. The amplifier circuit according to claim 7 wherein the bias circuit further comprises a first diode-connected transistor and a second diode-connected transistor, wherein the first diode-connected transistor is coupled in series between the first differential pair transistor and a second voltage source, and wherein the second diode-connected transistor is coupled in series between the second differential pair transistor and the second voltage source.

10. A method in an amplifier circuit comprising:

inputting first and second differential input signals into first and second circuit legs, respectively, wherein the first circuit leg includes a first transistor coupled in series with a first variable current source, and wherein the second circuit leg includes a second transistor coupled in series with a second variable current source;

dynamically setting the first variable current source to produce a first bias current in response to the first and second differential input signals;

dynamically setting the second variable current source to produce a second bias current in response to the first and second differential input signals, wherein the first bias current is set inversely proportional to the second bias current;

sinking the first bias current in the first circuit leg;

sinking the second bias current in the second circuit leg; and outputting first and second differential output signals from the first and second circuit legs, respectively, wherein the first variable current source includes a first cascode transistor in the first circuit leg that is coupled to a common current source, and wherein the second variable current source includes a second cascode transistor in the second circuit leg that is coupled to the common current source.

11. The method in an amplifier circuit according to claim 10 wherein the dynamically setting the first variable current source further comprises dynamically biasing the first cascode transistor in response to the first and second differential input signals, and wherein the dynamically setting the second variable current source further comprises dynamically biasing the second cascode transistor in response to the first and second differential input signals, and wherein the sinking the first and second bias currents further comprises sinking a total bias current through the common current source, wherein the total bias current is substantially equal to a sum of the first and second bias currents.

12. The method in an amplifier circuit according to claim 11 wherein the sinking the total bias current through the common current source further comprises sinking a total bias current wherein the total bias current has a substantially fixed value.

13. The method in an amplifier circuit according to claim 11 wherein the dynamically biasing the first cascode transistor, and the dynamically biasing the second cascode transistor further comprise:

producing a differential feedback signal in response to the first and second differential input signals;

producing a first bias signal for steering, in response to the differential feedback signal, a first portion of the total bias current through the first circuit leg;

producing a second bias signal for steering, in response to the differential feedback signal, a second portion of the total bias current through the second circuit leg;

dynamically biasing the first cascode transistor using the first bias signal; and dynamically biasing the second cascode transistor using the second bias signal.

14. The method in an amplifier circuit according to claim 13 wherein the first and second differential input signals are related to a differential voltage output of the amplifier circuit, and wherein the producing the differential feedback signal further comprises sensing a differential voltage output of the amplifier circuit and attenuating the differential voltage output.

15. The method in an amplifier circuit according to claim 13 wherein the differential feedback signal includes a first feedback voltage and a second feedback voltage, and wherein the producing the first bias signal and the producing the second bias signal further comprise:

sourcing a differential pair source current;

steering a first differential transistor current through a first differential transistor in a differential pair in response to the first feedback voltage;

steering a second differential transistor current through a second differential transistor in the differential pair in response to the second feedback voltage, wherein the sum of the first and second differential transistor currents is substantially equal to the differential pair source current;

producing the first bias signal across a first load coupled in series with the first differential transistor; and producing the second bias signal across a second load coupled in series with the second differential transistor.

16. The method in an amplifier circuit according to claim 15 wherein the producing the first bias signal across the first load, and the producing the second bias signal across the second load further comprise:

producing the first bias signal across a first diode-connected transistor coupled in series with the first differential transistor; and producing the second bias signal across a second diode-connected transistor coupled in series with the second differential transistor.

17. The method in an amplifier circuit according to claim 15 wherein the sourcing the differential pair source current further comprises sourcing a differential pair source current wherein the differential pair source current has a substantially fixed value.

18. A buffer circuit comprising:

a first current source having a first terminal, and having a second terminal coupled to a second voltage source;

a first transistor of a first conductivity type having a first current electrode, a second current electrode coupled to a first voltage source, and a control electrode coupled to a first buffer input;

a second transistor of the first conductivity type having a control electrode, a first current electrode coupled to the first terminal of the first current source, and a second current electrode coupled to the first current electrode of the first transistor, and to a first buffer output;

a third transistor of the first conductivity type having a first current electrode, a second current electrode coupled to the first voltage source, and a control electrode coupled to a second buffer input;

a fourth transistor of the first conductivity type having a control electrode, a first current electrode coupled to the first terminal of the first current source, and a second current electrode coupled to the first current electrode of the third transistor, and to a second buffer output;

a feedback circuit having a first sense input coupled to the first buffer output, and a second sense input coupled to the second buffer output, and having a first feedback signal output and a second feedback signal output; and a bias circuit comprising:

a first feedback input coupled to the first feedback signal output;

a second feedback input coupled to the second feedback signal output;

a first bias output coupled to the control electrode of the second transistor for dynamically controlling the second transistor in response to a voltage across the first feedback signal output and the second feedback signal output; and a second bias output coupled to the control electrode of the fourth transistor for dynamically controlling the fourth transistor in response to the voltage across the first feedback signal output and the second feedback signal output.

19. The buffer circuit according to claim 18 wherein the feedback circuit comprises:

a first resistive element having a first terminal coupled to the first buffer output, and having a second terminal coupled to the first feedback signal output;

a second resistive element having a first terminal coupled to the first feedback signal output, and having a second terminal coupled to the second feedback signal output; and a third resistive element having a first terminal coupled to the second feedback signal output, and having a second terminal coupled to the second buffer output.

20. The buffer circuit according to claim 18 wherein the bias circuit further comprises:

a second current source having a first terminal coupled to the first voltage source, and having a second terminal;

a fifth transistor of a second conductivity type having a first current electrode coupled to the second terminal of the second current source, a second current electrode, and a control electrode coupled to the first feedback input;

a sixth transistor of the first conductivity type having, a first current electrode coupled to the second voltage source, a second current electrode coupled to the second current electrode of the fifth transistor, and a control electrode coupled to the second current electrode of the sixth transistor, and to the first bias output;

a seventh transistor of the second conductivity type having a first current electrode coupled to the second terminal of the second current source, a second current electrode, and a control electrode coupled to the second feedback output; and an eighth transistor of the first conductivity type having, a first current electrode coupled to the second voltage source, a second current electrode coupled to the second current electrode of the seventh transistor, and a control electrode coupled to the second current electrode of the eighth transistor, and to the second bias output.

* * * * *